United States Patent
Celella et al.

(10) Patent No.: US 7,154,049 B2
(45) Date of Patent: Dec. 26, 2006

(54) APPARATUS FOR CROSSTALK COMPENSATION IN A TELECOMMUNICATIONS CONNECTOR

(75) Inventors: Brian Celella, Southington, CT (US); Vito Pagliarulo, Bristol, CT (US); Daniel Mullin, Plantsville, CT (US)

(73) Assignee: The Siemon Company, Watertown, CT (US)

( * ) Notice: Subject to any disclaimer, the term of this patent is extended or adjusted under 35 U.S.C. 154(b) by 293 days.

(21) Appl. No.: 10/716,808

(22) Filed: Nov. 19, 2003

(65) Prior Publication Data
US 2004/0147165 A1    Jul. 29, 2004

Related U.S. Application Data

(60) Provisional application No. 60/427,985, filed on Nov. 20, 2002.

(51) Int. Cl.
*H05K 7/06* (2006.01)
*H04B 3/32* (2006.01)

(52) U.S. Cl. .................. 174/261; 174/262; 333/12; 333/156; 333/161

(58) Field of Classification Search .................. None
See application file for complete search history.

(56) References Cited

U.S. PATENT DOCUMENTS

| | | | |
|---|---|---|---|
| 5,930,119 A | | 7/1999 | Berding |
| 5,997,358 A | * | 12/1999 | Adriaenssens et al. ...... 439/676 |
| 6,096,980 A | * | 8/2000 | Ferry .......................... 174/261 |
| 6,250,968 B1 | * | 6/2001 | Winings ...................... 439/676 |
| 6,333,472 B1 | * | 12/2001 | Weatherley ................. 174/262 |
| 6,379,157 B1 | * | 4/2002 | Curry et al. ................ 439/676 |
| 6,433,286 B1 | | 8/2002 | Doberenz |
| 6,448,640 B1 | | 9/2002 | Corisis |
| 6,483,714 B1 | | 11/2002 | Kabumoto et al. |
| 6,630,628 B1 | | 10/2003 | Devnani et al. |
| 6,796,847 B1 | * | 9/2004 | AbuGhazaleh et al. ..... 439/676 |
| 2004/0248468 A1 | * | 12/2004 | Gurovich et al. ........... 439/620 |

OTHER PUBLICATIONS

International Search Report, PCT/US03/37651, Sep. 27, 2004.

* cited by examiner

*Primary Examiner*—John B. Vigushin
(74) *Attorney, Agent, or Firm*—Cantor Colburn LLP

(57) ABSTRACT

A printed circuit board providing crosstalk compensation. The printed circuit board includes first plated through holes for receiving a first connecting component and second plated through holes for receiving a second connecting component. A signal carrying trace transmits a signal from one of the first plated through holes to one of the second plated through holes. A phase delay control trace is in electrical connection with the one of the first plated through holes. The phase delay control trace affects phase delay of the signal from the one of the first plated through holes to the one of the second plated through holes.

14 Claims, 13 Drawing Sheets

FIG. 1

| Case # | Pair Combination | Limit | NEXT loss magnitude limit 1), 4), 5) | NEXT loss phase limit 2), 3) |
|---|---|---|---|---|
| Case 1 | 3,6-4,5 | Low | ≤ 36.4-20log(f/100) | (-90 + 1.5·f/100) ± f/100 |
| Case 2 | 3,6-4,5 | Central | (37.0 ± 0.2)-20log(f/100) | (-90 + 1.5·f/100) ± f/100 |
| Case 3 | 3,6-4,5 | High | ≥ 37.6-20log(f/100) | (-90 + 1.5·f/100) ± f/100 |
| Case 4 | 1,2-3,6 | Low | ≤ 46.5-20log(f/100) | (-90 + 1.5·f/100) ± 3f/100 |
| Case 5 | 1,2-3,6 | High | ≥ 49.5-20log(f/100) | (-90 + 1.5·f/100) ± 3f/100 |
| Case 6 | 3,6-7,8 | Low | ≤ 46.5-20log(f/100) | (-90 + 1.5·f/100) ± 3f/100 |
| Case 7 | 3,6-7,8 | High | ≥ 49.5-20log(f/100) | (-90 + 1.5·f/100) ± 3f/100 |
| Case 8 | 1,2-4,5 | Low | ≤ 57-20log(f/100) | 90 ± (30·f/100) |
| Case 9 | 1,2-4,5 | High | ≥ 70-20log(f/100) | any phase |
| Case 10 | 4,5-7,8 | Low | ≤ 57-20log(f/100) | 90 ± (30·f/100) |
| Case 11 | 4,5-7,8 | High | ≥ 70-20log(f/100) | any phase |
| Case 12 | 1,2-7,8 | Low | ≤ 60-20log(f/100) | any phase |

1) Magnitude limits apply over the frequency range from 10 MHz to 250 MHz.
2) Phase limits apply over the frequency range from 50 MHz to 250 MHz.
3) When the measured plug NEXT loss is greater than 70 dB, the phase limit does not apply.
4) When a low limit NEXT loss calculation results in values greater than 70 dB, there shall be no low limit for NEXT loss.
5) When a high limit NEXT loss calculation results in values greater than 70 dB, the high limit NEXT shall revert to a limit of 70 dB.

APPARATUS FOR CROSSTALK COMPENSATION IN A TELECOMMUNICATIONS CONNECTOR

CROSS-REFERENCE TO RELATED APPLICATIONS

This application claims the benefit of U.S. provisional patent application Ser. No. 60/427,985 filed Nov. 20, 2002, the entire contents of which are incorporated herein by reference.

BACKGROUND OF THE INVENTION

The invention relates to telecommunications connectors and methods and apparatus for controlling signal delay in telecommunications connectors to improve NEXT, FEXT and return loss in terms of magnitude and upper frequency limits of transmission components and products. Near end crosstalk (NEXT), far end crosstalk (FEXT) and return loss limit tranmission rates of telecommuncations (e.g., voice, data, etc) connectors. Standard compensating techniques involving reactive (e.g., inductive and capacitive) coupling to generate compensating crosstalk to cancel offending crosstalk can only achieve limited success due to the limits defined by the TIA and IEC in terms of the magnitude and phase for both NEXT and FEXT of qualification plugs. ANSI/TIA/EIA-568-B.2-1 defines the magnitude and phase requirements for category 6 test plugs and is shown in the table in FIG. 1.

As an example, the TIA specifies the case 1 plug to have a specified magnitude (36.4 at 100 MHz) and phase $-90\pm1.5*f/100$. In order to cancel this offending crosstalk, the telecommuncaitons connector should provide a compensating crosstalk having the same magnitude of NEXT, but opposite phase, +90 degrees, as shown on the graph in FIG. 2. If the phase and magntiude match exaclty, the +90 and -90 lines will cancel each other out. In reality, it is difficult to match this phase exactly.

The failure to match phase of the offending crosstalk and the compensating crosstalk may result in increased NEXT and FEXT. For example, in a telecommunication system using tip and ring transmission pairs, residual current on the tip wire remaining after application of the compensating crosstalk (due to a phase mismatch) may loop back on the ring wire and induce additional compensating crosstalk. Existing solutions now add additional offending crosstalk to couteract the additional compensating crossstalk caused by residual currents. It is desirable to eliminate the need for introducing offending crosstalk.

BRIEF SUMMARY OF THE INVENTION

An embodiment of the invention is a printed circuit board providing crosstalk compensation. The printed circuit board includes first plated through holes for receiving a first connecting component and second plated through holes for receiving a second connecting component. A signal carrying trace transmits a signal from one of the first plated through holes to one of the second plated through holes. A phase delay control trace is in electrical connection with the one of the first plated through holes. The phase delay control trace affects phase delay of the signal from the one of the first plated through holes to the one of the second plated through holes.

BRIEF DESCRIPTION OF THE DRAWINGS

Referring now to the drawings wherein like elements are numbered alike in the several Figures:

FIG. 1 is table of TIA NEXT magnitude and NEXT phase limits;

DETAILED DESCRIPTION

Figure 2:
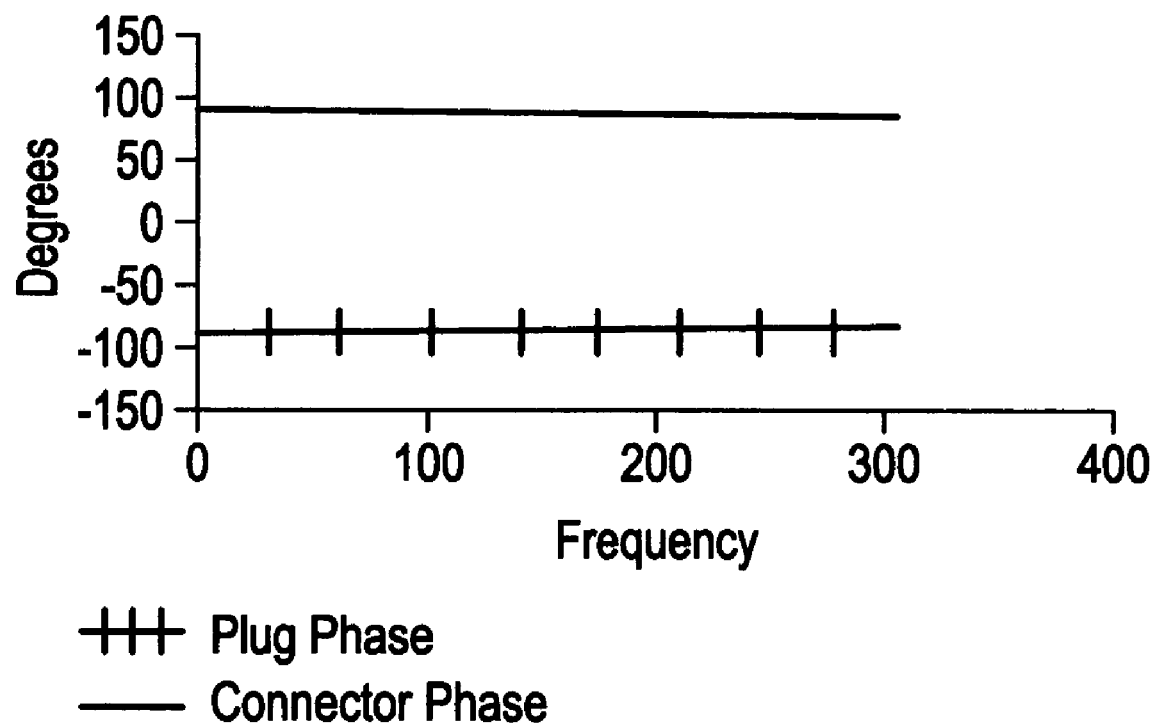
FIG. 2 is graph including a plot of plug phase and connector phase when NEXT is canceled.
Figure 3:
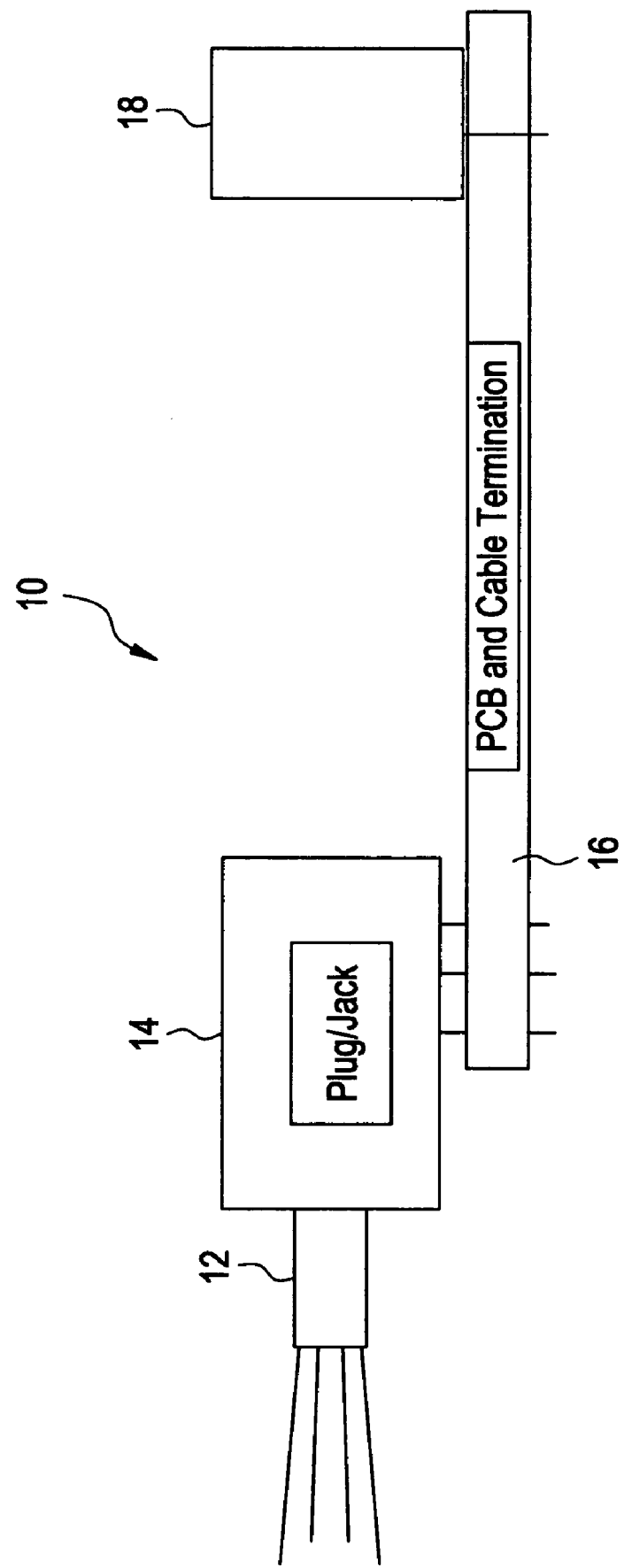
FIG. 3 is a side view of an exemplary telecommunications connector.

FIG. 3 is a side view of an exemplary telecommunications connector 10 designed to control phase of compensating crosstalk to improve transmission. The telecommunications connector 10 includes a plug 12 that is received in a first connecting component in the form of jack 14. In one embodiment of the invention, the plug is an RJ-45 jack carrying signals on a number (e.g., 4) twisted pairs of copper wire. The twisted pairs may be arranged in the plug in the T568A or T568B standard in which pair 4/5 is positioned between pair 3/6. Outlet 14 may similarly be an RJ-45 outlet and is mounted on a printed circuit board (PCB) 16. The PCB includes traces for carrying signals from the outlet 14 to a second connecting component in the form of wire termination block 18. The wire termination block may be a 110-type block as known in the art.

There is a phase shift due to the distance from the plug/jack interface to where the offending crosstalk is applied (e.g., PCB). It should be noted, the geometry and location of the jack 14 contacts that go from the jack/plug interface to the PCB 16 may affect the magnitude and phase of the offending crosstalk. Therefore, the PCB 16 and wire termination block 18 (or other termination devices) compensate for remaining crosstalk. The compensation should occur in both directions (i.e., from plug 12 to block 18 and from block 18 to plug 12). In addition, the TIA and IEC specify a range of performance for the modular plugs which directly contribute to the offending crosstalk.

Figure 4:
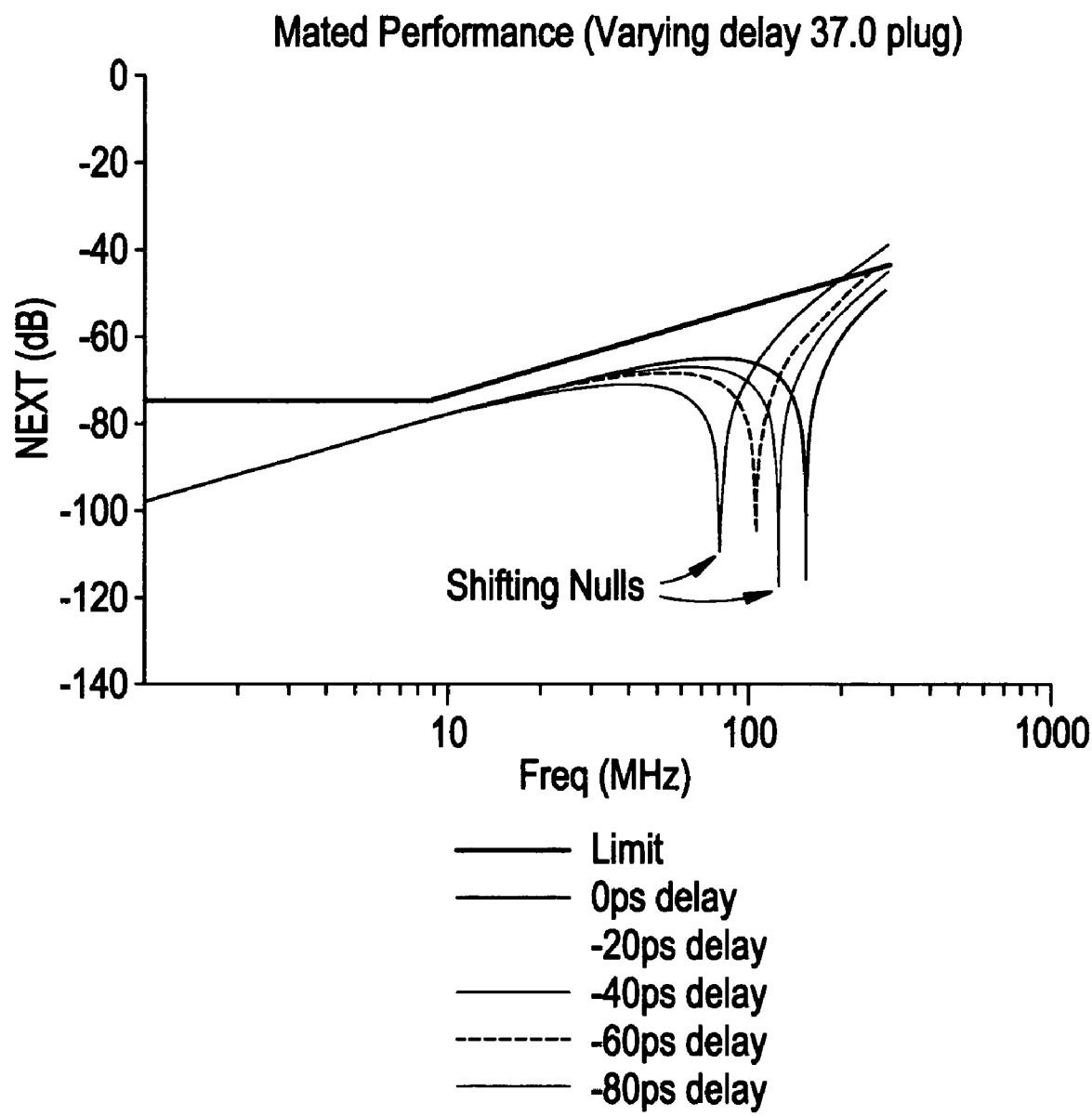
FIG. 4 is a graph of NEXT versus frequency for various phase delays.

To control the phase of compensating crosstalk in the telecommunications connector 10, phase control is performed on PCB 16. It is typically not possible to replicate the exact magnitude and phase of the offending crosstalk throughout the frequency range (e.g., from 0 to 300 MHz). FIG. 4 is a graph of NEXT versus frequency and depicts the acceptable NEXT limit. Assuming the magnitudes of the offending crosstalk in the plug/jack interface and the compensating crosstalk on the PCB/cable termination are equal, but out of phase, there is a non category 6 compliant response. This is shown in FIG. 4 as the plot having a NEXT null around 82 MHz corresponding to 0 ps of delay. By shifting the phase of the compensating crosstalk via manipulating the phase delay on the PCB 16, the upper frequency performance becomes below the limit without manipulating the magnitude of the compensation. In other words, a phase delay can improve high end performance without adding more reactive (e.g., inductance, capacitance) compensation. The plots in FIG. 4 show how cumulative −20 ps delays results in high frequency (e.g., 300 MHz) NEXT being below the limit.

Figure 5:
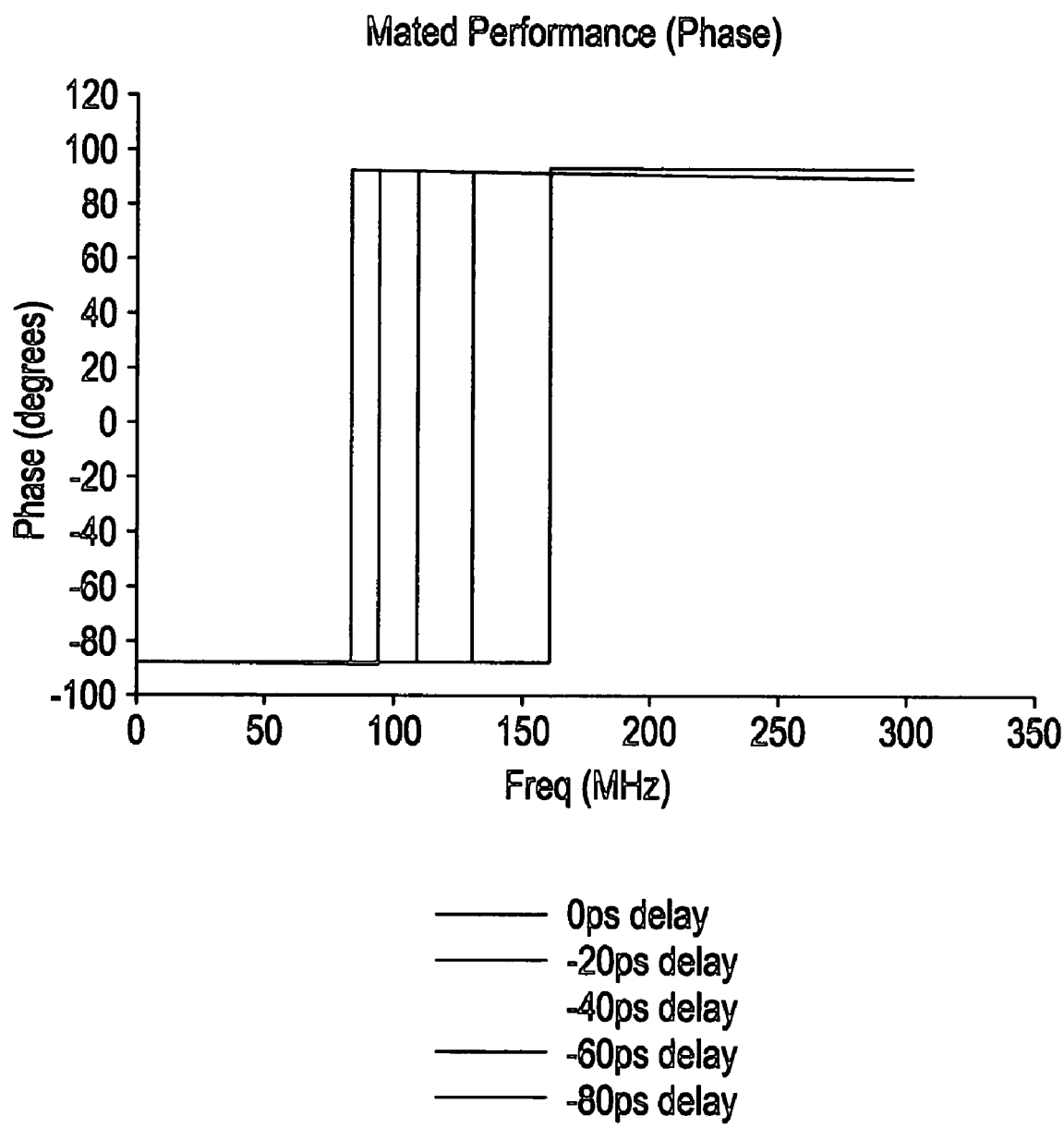
FIG. 5 is a graph of phase versus frequency for various phase delays.

FIG. 5 illustrates how changing the delay alters the location of the NEXT null. For example, a −80 ps delay results in a NEXT null at approximately 160 MHZ. This null is also shown in FIG. 4. The introduction of phase delay in the compensating crosstalk is significant because adding inductive or capacitive coupling alone cannot improve the performance at the higher frequencies.

Figure 6:
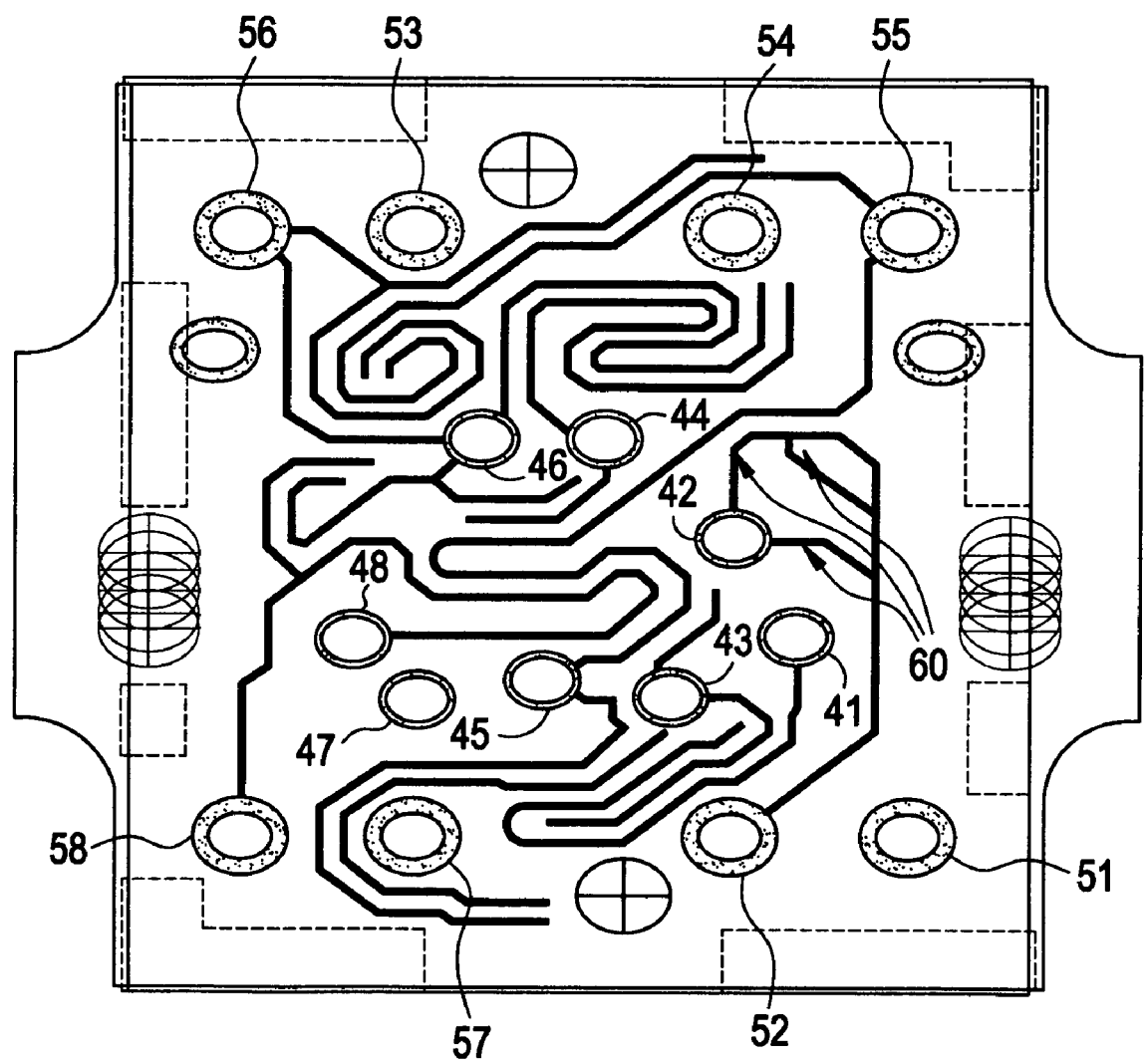
FIG. 6 depicts a printed circuit board including phase delay control traces.
Figure 7:
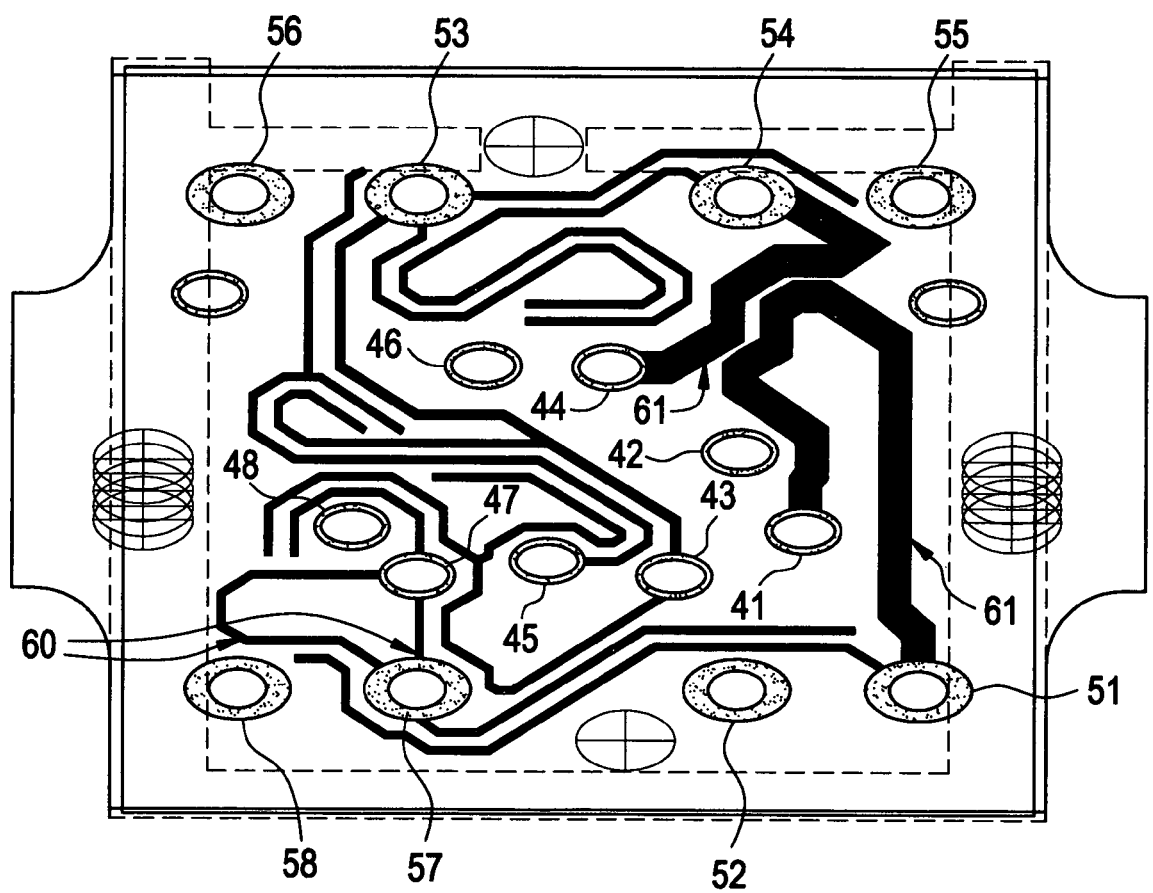
FIG. 7 depicts a printed circuit board including phase delay control traces.

In one embodiment of the invention, control of the compensating crosstalk phase delay is achieved by using traces on PCB 16. FIGS. 6 and 7 illustrate two techniques for controlling compensating crosstalk phase delay and compensating crosstalk magnitude. The PCB in FIG. 6 includes plated through holes 41–48 for receiving contacts in jack 14. Plated through holes 51–58 receive contacts on wire termination block 18. Signal carrying traces provide a path from through holes 41–48 to through holes 51–58. As known in the art, the contacts are arranged in pairs with contacts 1/2, 3/6, 4/5 and 7/8 defining four pairs.

As shown in FIG. 6, crosstalk magnitude compensation is achieved by running crosstalk magnitude control traces adjacent to each other. For example, from through holes 43 and 45, parallel, shunt (or dead end) traces extend in order to provide compensating crosstalk to counteract offending crosstalk. The dead end traces are run in close proximity in order to provide reactive coupling. The is contrasted with isolated dead end traces discussed below with reference to FIG. 11.

The PCB of FIG. 6 also includes traces for controlling phase. From through hole 42 to through hole 52 are redundant traces 60. These redundant traces 60 provide less resistance between through hole 42 and through hole 52 and thus reduce the delay of the signal on this path. This results in the compensating crosstalk having a reduced phase delay thereby shifting the frequency at which the NEXT null occurs.

An alternate technique for adjusting phase delay is show in FIG. 7. Again, the PCB includes crosstalk magnitude control traces for adjusting magnitude of compensating crosstalk such as parallel shunt traces from through holes 51 and 57. Additionally, phase delay may be altered by varying the trace width. For example, the signal carrying trace 61 between through hole 41 and through 51 is thicker. This provides less resistance and thus less delay. Also, redundant signal carrying traces 60 are used between through holes 57 and 47.

Figure 8:
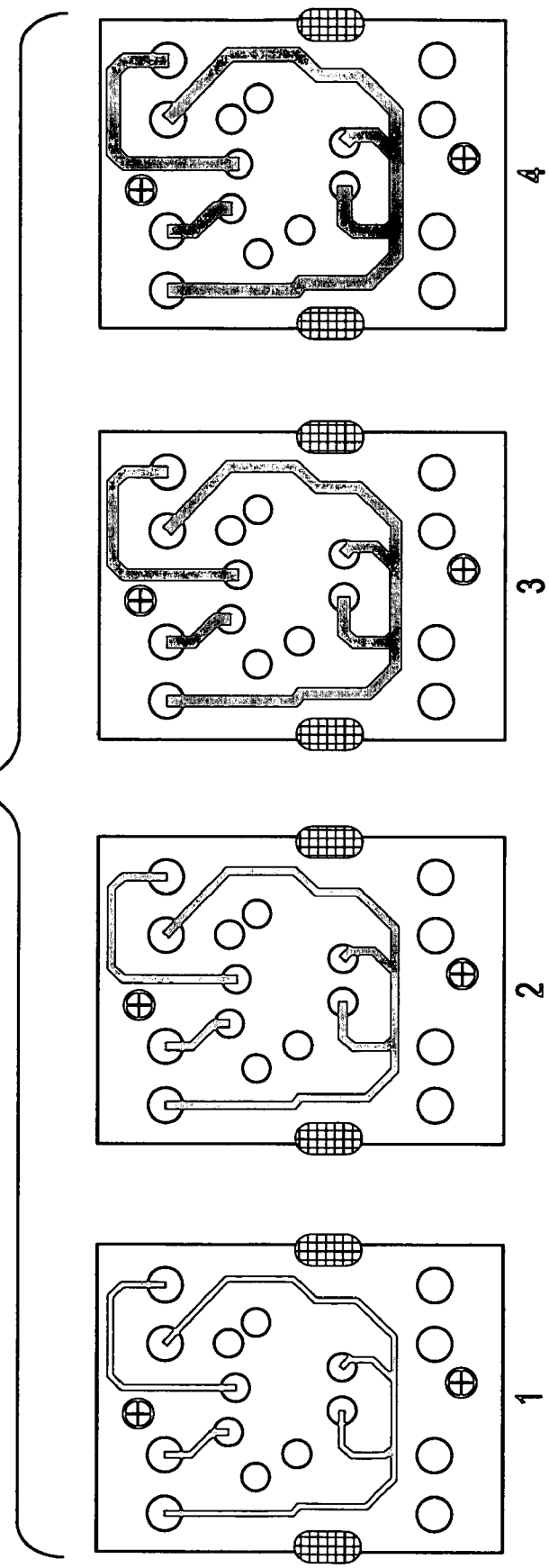
FIG. 8 depicts four printed circuit boards having varying trace widths.
Figure 9:
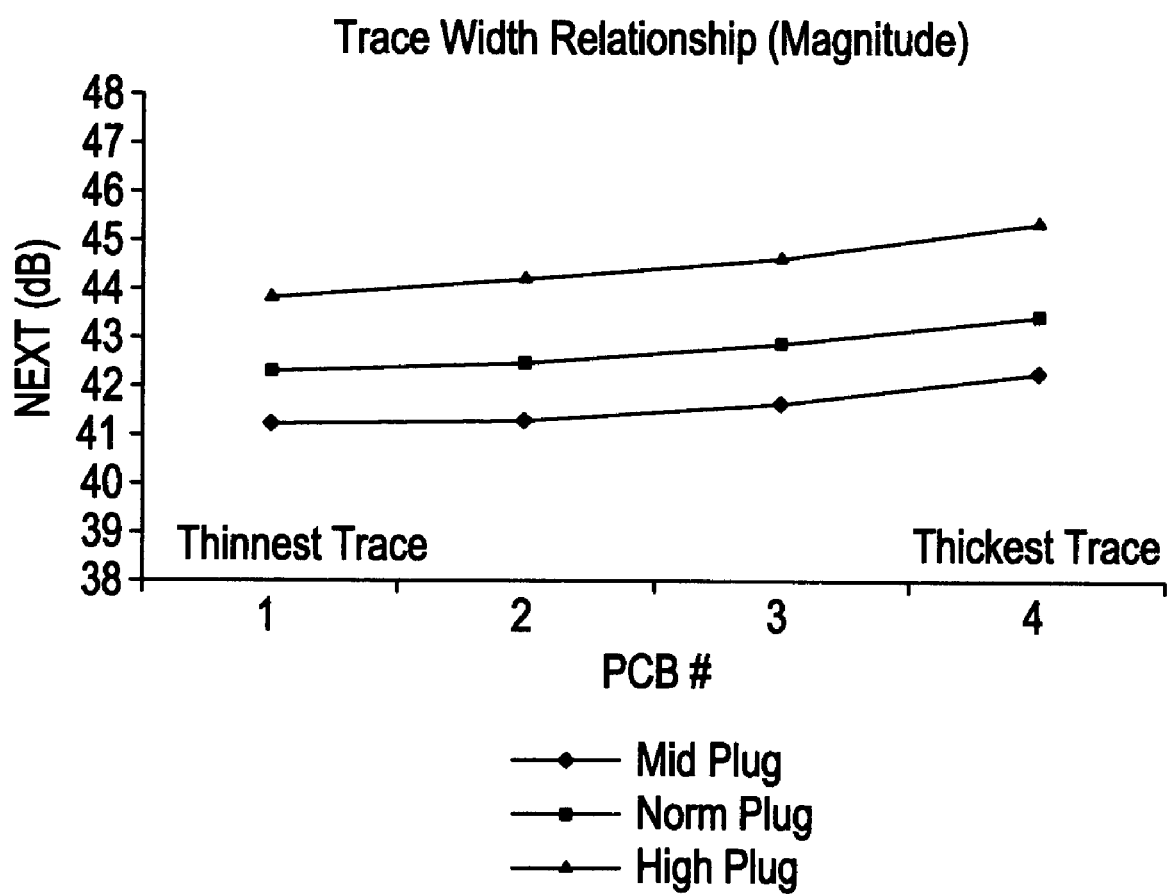
FIG. 9 is a graph of NEXT for each of the printed circuit boards in FIG. 8.
Figure 10:
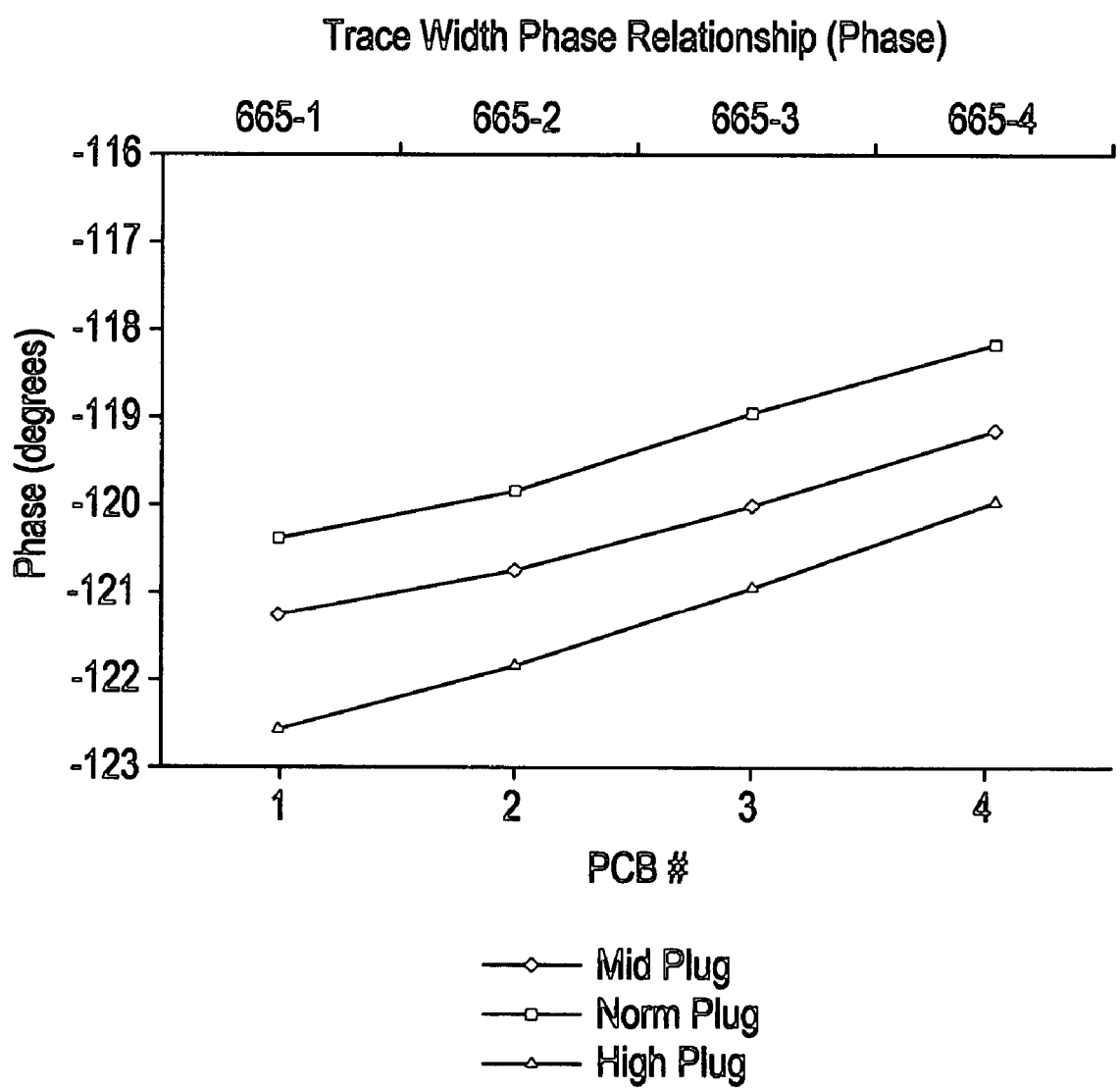
FIG. 10 is a graph of phase for each of the printed circuit boards in FIG. 8.

FIG. 8 shows 4 PCBs having differing trace widths, from thinnest to thickest, left to right. FIG. 9 is a plot of NEXT for each PCB shown in FIG. 8 for three different plugs. As shown in FIG. 9, the increase in trace width causes a corresponding increase in NEXT dB for multiple plugs (referenced as nom, mid and high). FIG. 10 shows the phase in degrees for each PCB for multiple plugs. Again, the relationship between trace width and phase change is evident.

Figure 11:
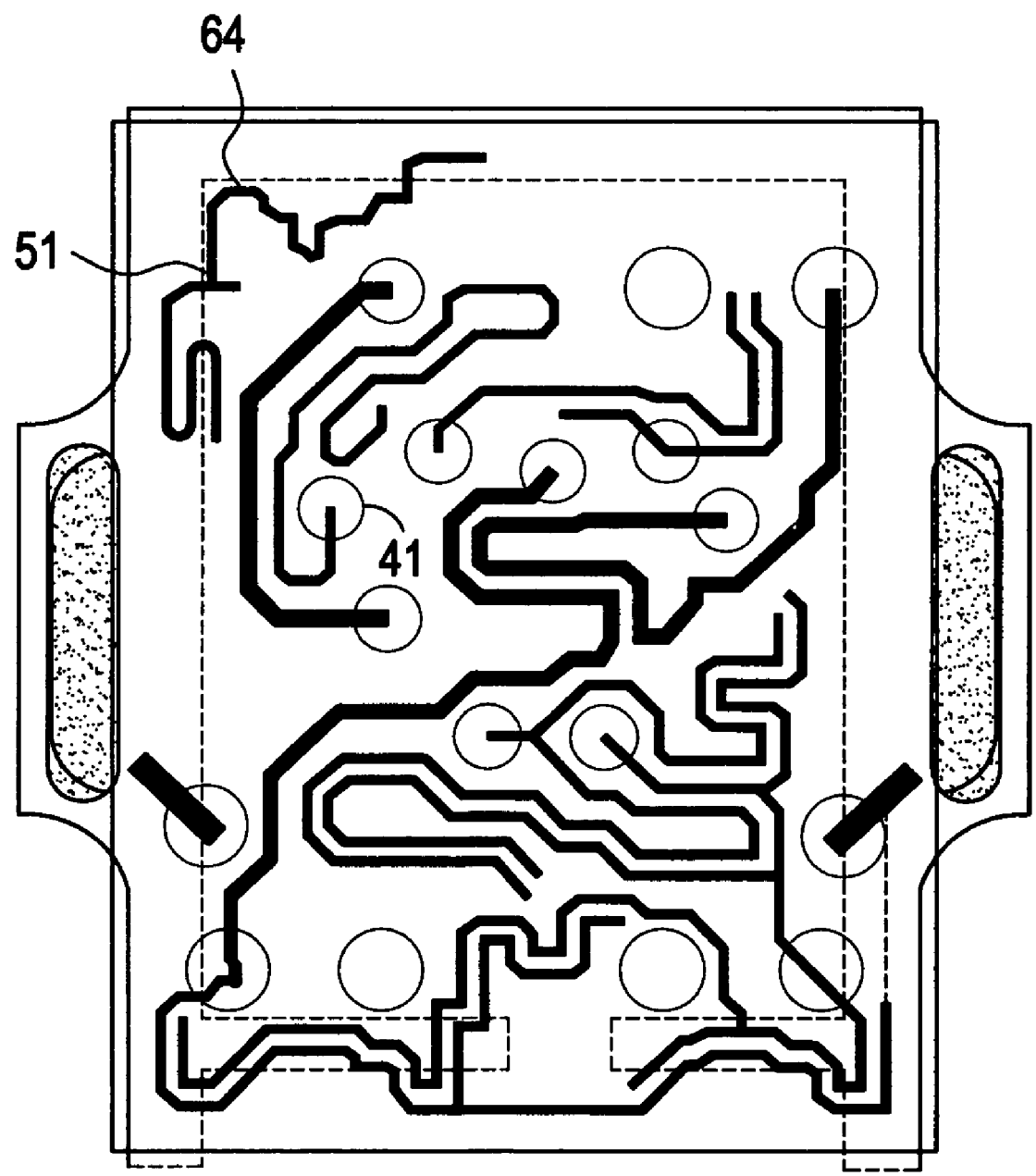
FIG. 11 depicts a printed circuit board including phase delay control traces in an alternate embodiment.

Another technique for manipulating delay can come in the form of isolated dead-end traces. FIG. 11 depicts a printed circuit board including phase delay control traces in an alternate embodiment. As shown in FIG. 11, plated through hole 51 is connected to phase delay control trace 64. Phase delay control trace 64 is an isolated, dead end trace that is positioned so as to not provided any reactive coupling. In other words, trace 64 is not run adjacent to another trace for the purposes of reactive coupling. Rather, the dead end trace 64 provides phase delay control for a signal traveling from plated through hole 51 to plated through hole 41. Multiple isolated, dead end traces may be used on the printed circuit board.

The isolated dead end trace 64 adds delay to the conductive path and may be used for multiple purposes. For example, a conductor of a pair may have the tip electrically longer than the ring so that the phase delay control trace 64 improves balance within a pair. Alternatively, phase delay control trace 64 may add delay to both conductors of certain pair to create better phase cancellation.

Figure 12:
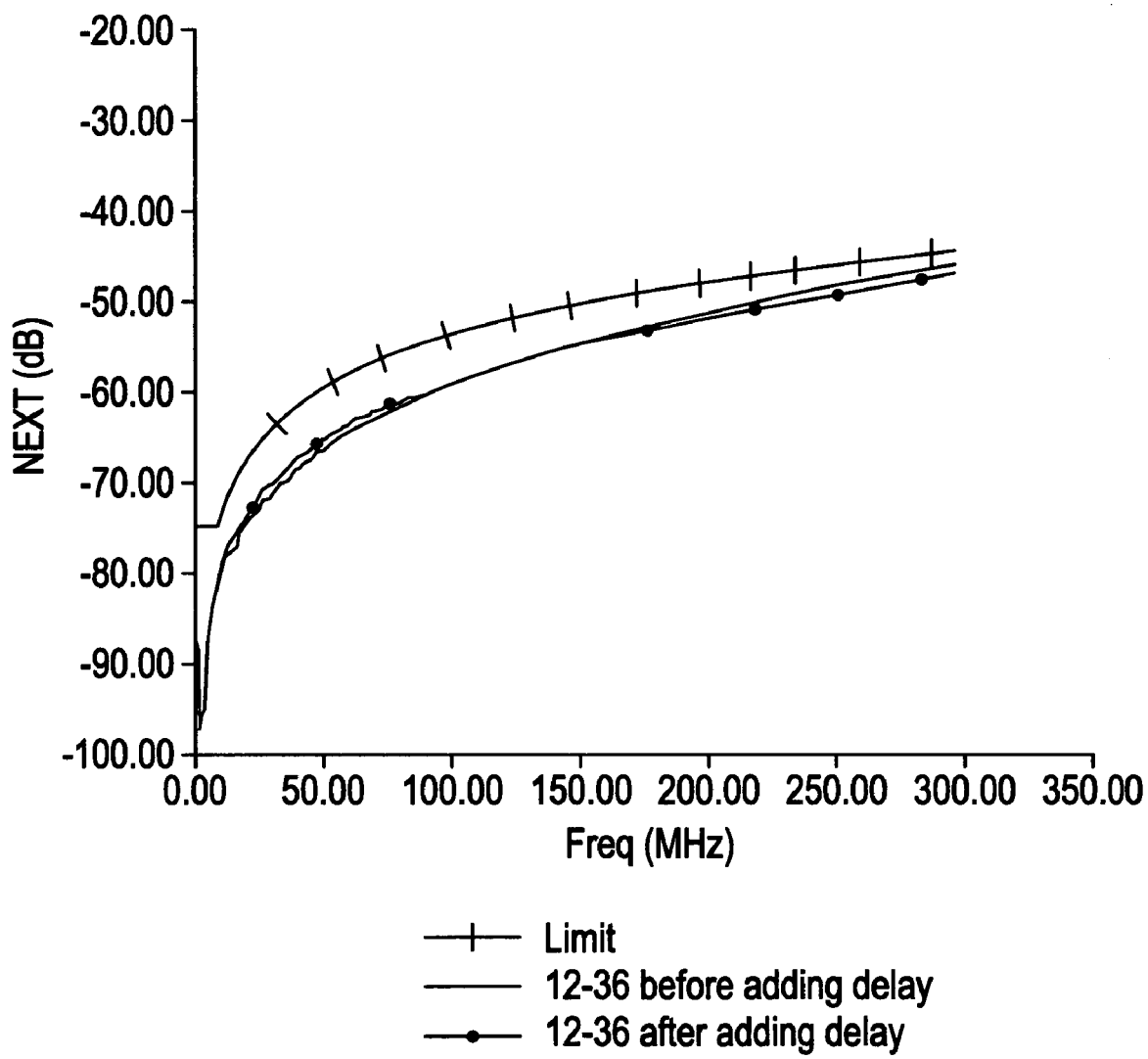
FIG. 12 is a graph of NEXT with and without the phase delay control trace of FIG. 11; and, FIG. 13 is a graph of NEXT with and without with the phase delay control trace of FIG. 11.
Figure 13:
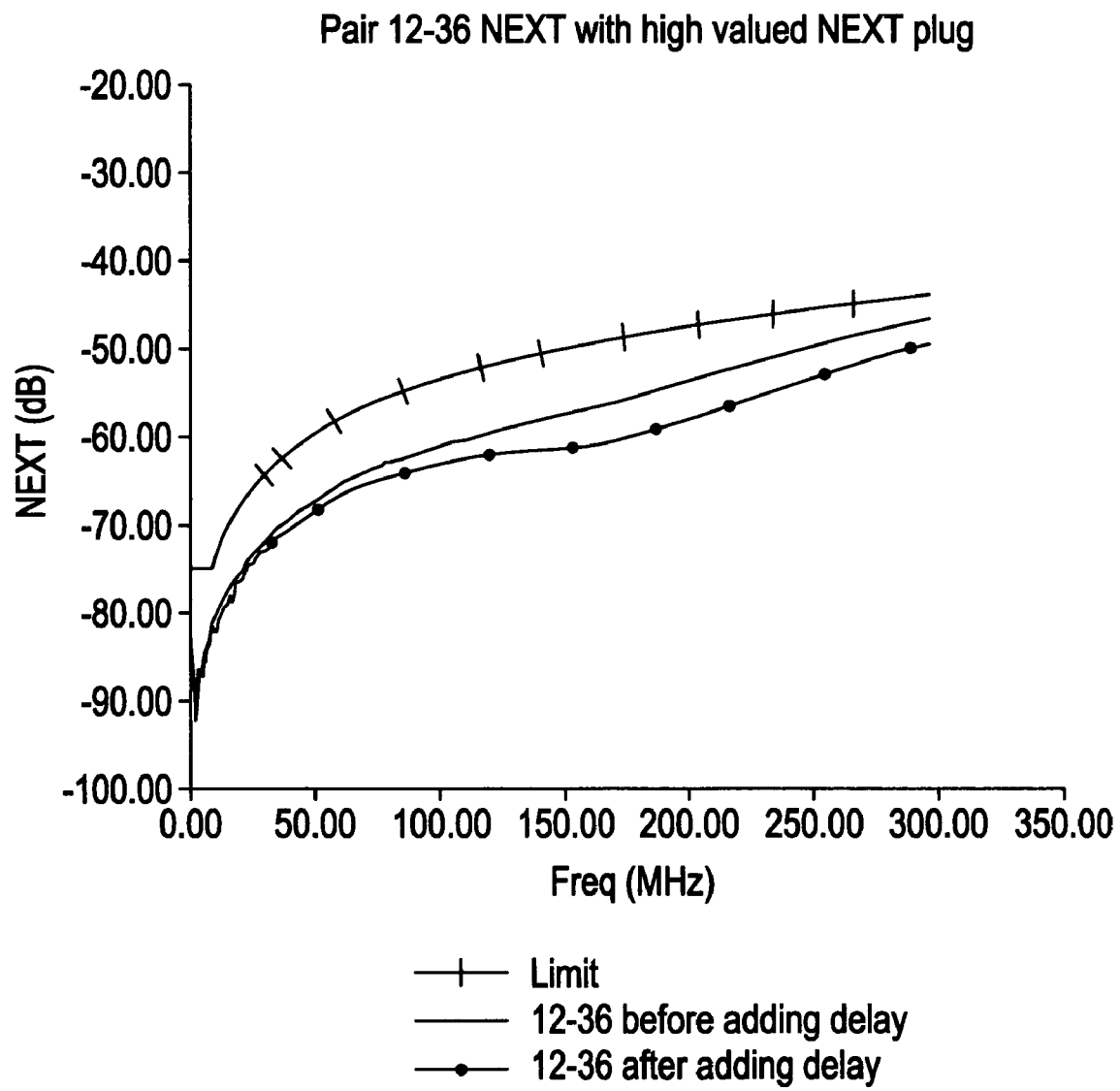

FIG. 12 is a graph of mated NEXT performance of a low valued NEXT plug and the connector using the printed circuit board of FIG. 11. Plots are shown both with and without the phase delay control trace 64. FIG. 13 is a graph of mated NEXT performance of a high valued NEXT plug and the connector using the printed circuit board of FIG. 11. Plots are shown for both with and without the phase delay control trace 64. The phase delay control trace provides an improvement in high frequency performance for the 1/2–3/6 pair combination with both low and high valued test plugs.

It is understood that the telecommunications connector 10 may have a variety of designs and is not limited to plug, jack and termination blocks. The connecting components may include two connecting blocks, two jacks, etc. Further, the embodiments of FIGS. 6, 7 and 11 include phase delay control traces that decrease phase delay through either redundant traces, increased trace width and/or dead end traces. Any trace dimension (e.g., trace depth) may also be adjusted to control phase delay. It is understood that phase delay may be increased by reducing trace width. Alternatively, different materials may be used on different traces to control phase delay. For example, a more conductive material may be used to reduce phase delay while a less conductive material may be used to increase phase delay. By combining crosstalk magnitude compensation (through reactance such as capacitance and inductance) and crosstalk phase delay control, enhanced performance may be achieved. Further, one or more dead end phase delay control traces of FIG. 11 may be used in conjunction with the phase delay control traces of FIGS. 6 and 7.

While the invention has been described with reference to a exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention.

What is claimed is:

1. A printed circuit board providing crosstalk compensation, the printed circuit board comprising:

first plated through holes for receiving a first connecting component;
second plated through holes for receiving a second connecting component;
a signal carrying trace for transmitting a signal from one of said first plated through holes to one of said second plated through holes;
a phase delay control trace in electrical connection with said one of said first plated through holes, said phase delay control trace affecting phase delay of said signal from said one of said first plated through holes to said one of said second plated through holes, the phase delay control trace configured to shift the phase of crosstalk relative to another trace reactively coupled to the phase delay control trace.

2. The printed circuit board of claim 1 wherein:
said first connecting component is an outlet.

3. The printed circuit board of claim 1 wherein:
second connecting component is a wire termination block.

4. The printed circuit board of claim 1 further comprising:
a crosstalk magnitude control trace in electrical connection with said one of said first plated through holes, said crosstalk magnitude control trace being reactively coupled with another trace to control crosstalk magnitude.

5. A printed circuit board providing crosstalk compensation, the printed circuit board comprising:
first plated through holes for receiving a first connecting component;
second plated through holes for receiving a second connecting component;
a signal carrying trace for transmitting a signal from one of said first plated through holes to one of said second plated through holes;
a phase delay control trace in electrical connection with said one of said first plated through holes, said phase delay control trace affecting phase delay of said signal from said one of said first plated through holes to said one of said second plated through holes, the phase delay control trace configured to shift the phase of crosstalk;
wherein:
said phase delay control trace and said signal carrying trace are the same, single trace.

6. A printed circuit board providing crosstalk compensation, the printed circuit board comprising:
first plated through holes for receiving a first connecting component;
second plated through holes for receiving a second connecting component;
a signal carrying trace for transmitting a signal from one of said first plated through holes to one of said second plated through holes;
a phase delay control trace in electrical connection with said one of said first plated through holes, said phase delay control trace affecting phase delay of said signal from said one of said first plated through holes to said one of said second plated through holes, the phase delay control trace configured to shift the phase of crosstalk;
wherein:
said phase delay control trace is made from a material having a conductivity different than the conductivity of a material of other traces on the printed circuit board in order to affect the phase delay of said signal from said one of said first plated through holes to said one of said second plated through holes.

7. A printed circuit board providing crosstalk compensation, the printed circuit board comprising:
first plated through holes for receiving a first connecting component;
second plated through holes for receiving a second connecting component;
a signal carrying trace for transmitting a signal from one of said first plated through holes to one of said second plated through holes;
a phase delay control trace in electrical connection with said one of said first plated through holes, said phase delay control trace affecting phase delay of said signal from said one of said first plated through holes to said one of said second plated through holes, the phase delay control trace configured to shift the phase of crosstalk;
wherein:
said phase delay control trace includes multiple redundant phase delay control traces in order to provide increased conductivity.

8. A printed circuit board providing crosstalk compensation, the printed circuit board comprising:
first plated through holes for receiving a first connecting component;
second plated through holes for receiving a second connecting component;
a signal carrying trace for transmitting a signal from one of said first plated through holes to one of said second plated through holes;
a phase delay control trace in electrical connection with said one of said first plated through holes, said phase delay control trace affecting phase delay of said signal from said one of said first plated through holes to said one of said second plated through holes, the phase delay control trace configured to shift the phase of crosstalk;
wherein:
said phase delay control trace includes an increased cross-sectional dimension relative to other traces on the printed circuit board in order to provide said increased conductivity.

9. A. printed circuit board providing crosstalk compensation, the printed circuit board comprising:
first plated through holes for receiving a first connecting component;
second plated through holes for receiving a second connecting component;
a signal carrying trace for transmitting a signal from one of said first plated through holes to one of said second plated through holes;
a phase delay control trace in electrical connection with said one of said first plated through holes, said phase delay control trace affecting phase delay of said signal from said one of said first plated through holes to said one of said second plated through holes, the phase delay control trace configured to shift the phase of crosstalk;
wherein:
said phase delay control trace is an isolated dead end trace separate from signal carrying trace, said dead end trace isolated to avoid reactive coupling with other traces.

10. A printed circuit board providing crosstalk compensation, the printed circuit board comprising:
first plated through holes for receiving a first connecting component;
second plated through holes for receiving a second connecting component;

a signal carrying trace for transmitting a signal from one of said first plated through holes to one of said second plated through holes;

a phase delay control trace in electrical with said one of said first plated through holes, said phase delay control trace affecting phase delay of said signal from said one of said first plated through holes to said one of said second plated through holes, the phase delay control is configured to shift the phase of crosstalk;

wherein:

said phase delay control trace includes a first phase delay control trace and a second phase delay control trace.

11. The printed circuit board of claim 10 wherein:

said first phase delay control trace is the same as said signal carrying trace; and said second phase delay control trace is an isolated dead end trace separate from signal carrying trace, said dead end trace isolated to avoid reactive coupling with other traces.

12. The printed circuit board of claim 11 wherein:

said first phase delay control trace includes multiple redundant phase delay control traces in order to affect the phase delay of said signal from said one of said first plated through holes to said one of said second plated through holes.

13. A printed circuit board providing crosstalk compensation, the printed circuit board comprising:

first plated through holes for receiving a first connecting component;

second plated through holes for receiving a second connecting component;

a signal currying trace for transmitting a signal from one of said first plated through holes to one of said second plated through holes;

a phase delay control trace in electrical connection with said one of said first plated through holes, said phase delay control trace affecting phase delay of said signal from said one of said first plated through holes to said one of said second plated through holes;

said phase delay control trace is an isolated dead end trace separate from signal carrying trace, said dead end trace isolated to avoid reactive coupling with other traces;

said signal carrying trace has an increased thickness in order to affect the phase delay of said signal from said one of said first plated through holes to said one of said second plated through holes.

14. A telecommunications connector comprising:

a first connecting component for connection with a first cable;

a second connection component for connection with a second cable;

a printed circuit board providing crosstalk compensation, the printed circuit board including:

first plated through holes for receiving a first connecting component;

second plated through holes for receiving a second connecting component;

a signal carrying trace for transmitting a signal from one of said first plated through boles to one of said second plated through holes;

a phase delay control trace in electrical connection with said one of said first plated through holes, said phase delay control trace affecting phase delay of said signal from said one of said first plated through holes to said one of said second plated through holes, the phase delay control trace configured to shift the phase of crosstalk relative to another trace reactively coupled to the phase delay control trace.

* * * * *